(12) United States Patent
Yoshimura et al.

(10) Patent No.: US 10,468,563 B2
(45) Date of Patent: Nov. 5, 2019

(54) LIGHT-EMITTING DEVICE AND IMAGE DISPLAY APPARATUS

(71) Applicant: Sharp Kabushiki Kaisha, Sakai, Osaka (JP)

(72) Inventors: Kenichi Yoshimura, Sakai (JP); Makoto Izumi, Sakai (JP); Hiroshi Fukunaga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/024,935

(22) Filed: Jul. 2, 2018

(65) Prior Publication Data

US 2019/0140148 A1    May 9, 2019

(30) Foreign Application Priority Data

Aug. 2, 2017 (JP) .................. 2017-149992

(51) Int. Cl.
*H01L 33/50* (2010.01)
*C09K 11/64* (2006.01)
*C09K 11/77* (2006.01)
*C09K 11/61* (2006.01)
*C09K 11/08* (2006.01)
*G02F 1/1335* (2006.01)

(52) U.S. Cl.
CPC ........ *H01L 33/504* (2013.01); *C09K 11/0883* (2013.01); *C09K 11/617* (2013.01); *C09K 11/64* (2013.01); *C09K 11/7734* (2013.01); *G02F 1/133603* (2013.01); *G02F 1/133606* (2013.01); *H01L 2933/0041* (2013.01)

(58) Field of Classification Search
CPC .................. H01L 33/504; H01L 2933/0041
USPC ........................................... 257/98; 313/498
See application file for complete search history.

(56) References Cited

U.S. PATENT DOCUMENTS

| | | | |
|---|---|---|---|
| 2004/0251832 A1* | 12/2004 | Choi | ........ C09K 11/595 313/582 |
| 2005/0127811 A1* | 6/2005 | Choi | ........ C09K 11/778 313/486 |
| 2009/0121608 A1 | 5/2009 | Xie et al. | |
| 2010/0091215 A1 | 4/2010 | Fukunaga et al. | |
| 2011/0043101 A1 | 2/2011 | Masuda et al. | |
| 2012/0212122 A1* | 8/2012 | Thomas | ........ C09K 11/0883 313/498 |
| 2016/0104820 A1* | 4/2016 | Lim | ........ H01L 33/504 257/98 |

(Continued)

FOREIGN PATENT DOCUMENTS

JP     2009-96854 A    5/2009
JP     2010-93132 A    4/2010

(Continued)

*Primary Examiner* — David Vu
*Assistant Examiner* — Brandon C Fox
(74) *Attorney, Agent, or Firm* — Keating & Bennett, LLP

(57) ABSTRACT

A light-emitting device includes a light-emitting element that emits blue light, a $Mn^{2+}$-activated γ-AlON phosphor and a $Eu^{2+}$-activated β-SiAlON phosphor that are excited by the blue light to emit green light, and a red phosphor that is excited by the blue light to emit red light. The weight ratio of the $Mn^{2+}$-activated γ-AlON phosphor to the $Eu^{2+}$-activated β-SiAlON phosphor is from 20 to 75.

11 Claims, 8 Drawing Sheets

(56) References Cited

U.S. PATENT DOCUMENTS

| | | | |
|---|---|---|---|
| 2017/0047488 A1* | 2/2017 | Kaneko | H01L 33/504 |
| 2017/0062668 A1 | 3/2017 | Yoshimura et al. | |
| 2017/0146856 A1 | 5/2017 | Yokota | |
| 2017/0279012 A1 | 9/2017 | Yoshimura et al. | |
| 2017/0315405 A1 | 11/2017 | Masuda et al. | |
| 2018/0323350 A1* | 11/2018 | Oh | C09K 11/7734 |

FOREIGN PATENT DOCUMENTS

| | | |
|---|---|---|
| JP | 2015-061009 A | 3/2015 |
| JP | 2015-194637 A | 11/2015 |
| JP | 2017-50523 A | 3/2017 |
| JP | 2017-50524 A | 3/2017 |
| JP | 2017-50525 A | 3/2017 |
| JP | 2017-183362 A | 10/2017 |
| WO | 2007/099862 A1 | 9/2007 |
| WO | 2009/110285 A1 | 9/2009 |
| WO | 2016/056485 A1 | 4/2016 |

* cited by examiner

FIG. 8

| LIGHT-EMITTING DEVICE | GREEN PHOSPHOR 12a | GREEN PHOSPHOR 12b | WEIGHT RATIO OF GREEN PHOSPHOR 12a TO GREEN PHOSPHOR 12b | WEIGHT RATIO OF GREEN PHOSPHORS TO RED PHOSPHOR | WEIGHT RATIO OF PHOSPHORS TO DISPERSION MEDIUM | LUMINOUS FLUX (RELATIVE VALUE) OF LIGHT-EMITTING DEVICE | CHROMATICITY COORDINATES OF WHITE POINT AFTER PASSAGE THROUGH LIQUID CRYSTAL PANEL | |
|---|---|---|---|---|---|---|---|---|
| | | | | | | | CIEx | CIEy |
| EXAMPLE D1 | PRODUCTION EXAMPLE G1 | PRODUCTION EXAMPLE G2 | 72.4 | 13.1 | 1.24 | 123 | 0.280 | 0.288 |
| EXAMPLE D2 | PRODUCTION EXAMPLE G1 | PRODUCTION EXAMPLE G2 | 50.8 | 11.6 | 1.10 | 132 | 0.280 | 0.288 |
| EXAMPLE D3 | PRODUCTION EXAMPLE G1 | PRODUCTION EXAMPLE G2 | 36.1 | 10.0 | 0.97 | 143 | 0.280 | 0.288 |
| EXAMPLE D4 | PRODUCTION EXAMPLE G1 | PRODUCTION EXAMPLE G2 | 25.7 | 8.4 | 0.83 | 145 | 0.280 | 0.288 |
| COMPARATIVE EXAMPLE D1 | PRODUCTION EXAMPLE G1 | — | — | 15.9 | 1.52 | 100 | 0.281 | 0.288 |

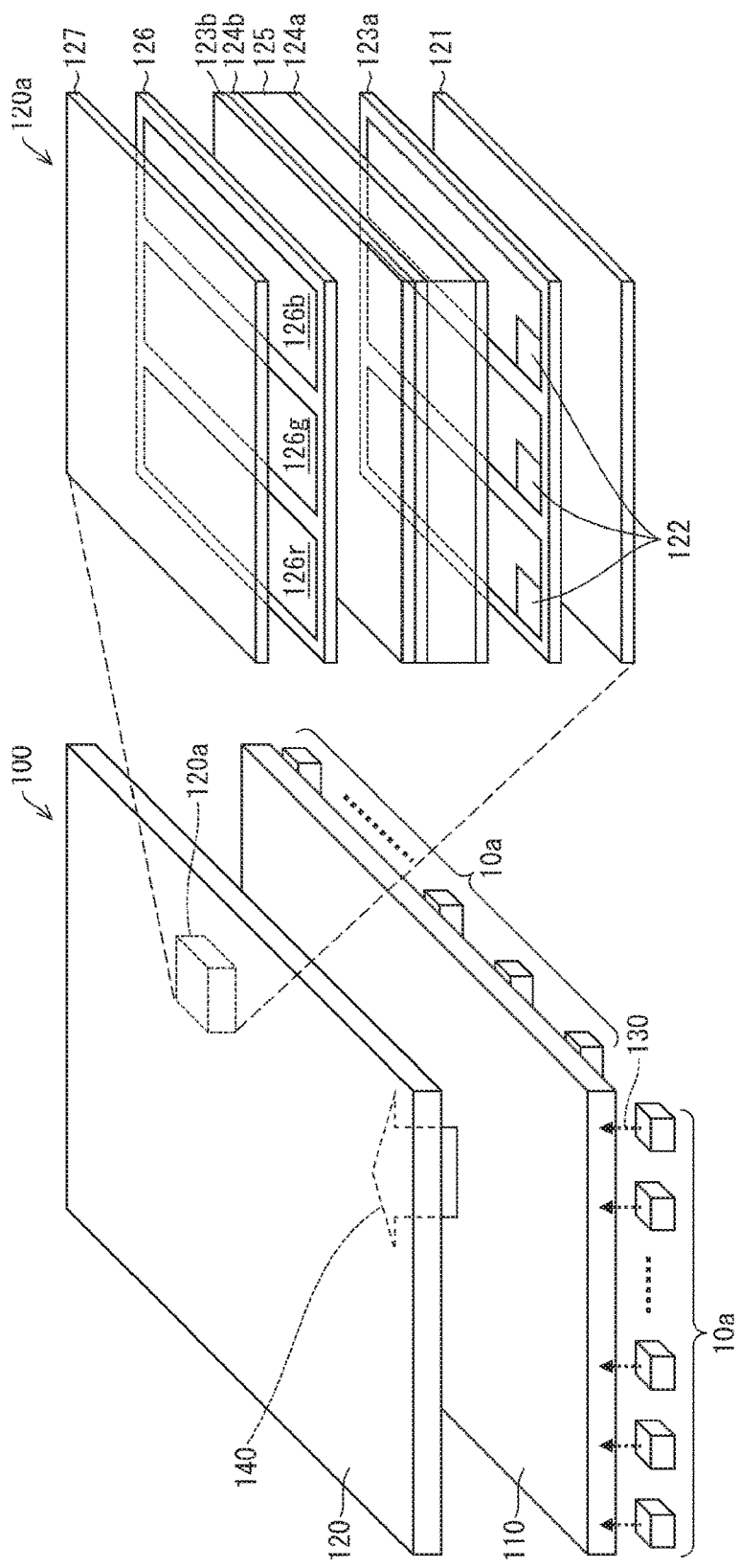

FIG. 10

| IMAGE DISPLAY APPARATUS | LIGHT-EMITTING DEVICE | COLOR GAMUT | | RED POINT | | GREEN POINT | | BLUE POINT | |
|---|---|---|---|---|---|---|---|---|---|
| | | BT.2020 COVERAGE | BT.2020 PERCENT AREA | x | y | x | y | x | y |
| EXAMPLE DIS1 | EXAMPLE D1 | 81.8% | 83.6% | 0.674 | 0.300 | 0.182 | 0.727 | 0.155 | 0.030 |
| EXAMPLE DIS2 | EXAMPLE D2 | 81.3% | 83.1% | 0.673 | 0.300 | 0.185 | 0.725 | 0.155 | 0.029 |
| EXAMPLE DIS3 | EXAMPLE D3 | 80.8% | 82.6% | 0.672 | 0.301 | 0.188 | 0.724 | 0.155 | 0.029 |
| EXAMPLE DIS4 | EXAMPLE D4 | 80.3% | 82.1% | 0.671 | 0.301 | 0.191 | 0.722 | 0.155 | 0.029 |
| COMPARATIVE EXAMPLE DIS2 | COMPARATIVE EXAMPLE D2 | 79.3% | 81.0% | 0.669 | 0.303 | 0.197 | 0.719 | 0.156 | 0.029 |

FIG. 11

| LIGHT-EMITTING DEVICE | PEAK WAVELENGTH OF LIGHT-EMITTING ELEMENT 11 | WEIGHT RATIO OF GREEN PHOSPHOR 12a TO GREEN PHOSPHOR 12b | WEIGHT RATIO OF GREEN PHOSPHORS TO RED PHOSPHOR | WEIGHT RATIO OF PHOSPHORS TO DISPERSION MEDIUM | LUMINOUS FLUX (RELATIVE VALUE) OF LIGHT-EMITTING DEVICE | CHROMATICITY COORDINATES OF WHITE POINT AFTER PASSAGE THROUGH LIQUID CRYSTAL PANEL | |
|---|---|---|---|---|---|---|---|
| | | | | | | CIEx | CIEy |
| EXAMPLE D1 | 445nm | 72.4 | 13.1 | 1.24 | 100 | 0.280 | 0.288 |
| EXAMPLE D5 | 430nm | 74.1 | 13.5 | 1.29 | 83 | 0.280 | 0.288 |
| EXAMPLE D6 | 440nm | 51.3 | 11.5 | 1.16 | 97 | 0.281 | 0.288 |

LIGHT-EMITTING DEVICE AND IMAGE DISPLAY APPARATUS

BACKGROUND

1. Field

The present disclosure relates to light-emitting devices and image display apparatuses including light-emitting devices.

2. Description of the Related Art

Recently, light-emitting devices have been developed that include a combination of (i) a semiconductor light-emitting element such as a light-emitting diode (LED) and (ii) a wavelength-converting member that converts excitation light emitted from the semiconductor light-emitting element into fluorescence (e.g., a member formed of a resin dispersion medium having phosphor particles dispersed therein). These light-emitting devices have the advantage of being small and consuming less power than incandescent lamps. Thus, these light-emitting devices have been used as light sources for various image display apparatuses and illumination apparatuses.

As such light-emitting devices, those including a combination of a blue LED and green and red phosphors are known.

When light-emitting devices are used for image display apparatuses, one of the measures for evaluating the practicality of image display apparatuses is the size of the color gamut of image display apparatuses.

To define a color gamut, color gamut standards such as NTSC (National Television System Committee) and Adobe RGB have so far been adopted. However, a color gamut standard known as BT.2020 (broadcasting service (television) 2020), which can reproduce almost all colors found in nature, will be newly adopted for 8K broadcasting, which will start in 2020. To meet the BT.2020 color gamut standard, it is desirable to display a much wider color gamut than the conventional NTSC and Adobe RGB color gamut standards.

Here, the BT.2020 color gamut is defined in the CIE (Commission Internationale de l'Eclairage) 1931 chromaticity diagram by a triangle enclosed by the following three chromaticity points: (CIEx, CIEy)=(0.708, 0.292), (0.170, 0.797), and (0.131, 0.046). The NTSC color gamut is defined in the CIE 1931 chromaticity diagram by a triangle enclosed by the following three chromaticity points: (CIEx, CIEy)= (0.670, 0.330), (0.210, 0.710), and (0.140, 0.080). The Adobe RGB color gamut is defined in the CIE 1931 chromaticity diagram by a triangle enclosed by the following three chromaticity points: (CIEx, CIEy)=(0.640, 0.330), (0.210, 0.710), and (0.150, 0.060). One of the measures for evaluating the practicality of image display apparatuses is coverage, which indicates how much of a color gamut triangle is covered.

International Publication No. WO2016/056485 (published on Apr. 14, 2016) discloses an image display apparatus having a much wider color gamut than Adobe RGB (Adobe Over). This image display apparatus includes a combination of a white illumination element including a blue LED, a $Eu^{2+}$-activated β-SiAlON phosphor, serving as a green phosphor, and a $Mn^{4+}$-activated fluoride complex phosphor, serving as a red phosphor, with an improved color filter. However, the coverage of the BT.2020 color gamut calculated from the color gamut of this image display apparatus is less than 80%.

Japanese Unexamined Patent Application Publication No. 2017-050525 (published on Mar. 9, 2017) discloses a technique for achieving a wide color gamut using a $Mn^{2+}$-activated γ-AlON phosphor, serving as a green phosphor, and a $Mn^{4+}$-activated fluoride complex phosphor, serving as a red phosphor. The coverage of the BT.2020 color gamut by the color gamut of the image display apparatus disclosed in this publication is 82.7%.

The image display apparatus disclosed in this publication, however, has a problem in that the light-emitting device has low luminous efficiency, as discussed later. Thus, there is still room for improvement in techniques for improving the performance of image display apparatuses.

SUMMARY

It is therefore desirable to provide a light-emitting device that can achieve both a wide color gamut and high luminous efficiency.

According to an aspect of the present disclosure, there is provided a light-emitting device including a light-emitting element that emits blue light, a $Mn^{2+}$-activated γ-AlON phosphor and a $Eu^{2+}$-activated β-SiAlON phosphor that are excited by the blue light to emit green light, and a red phosphor that is excited by the blue light to emit red light. The weight ratio of the $Mn^{2+}$-activated γ-AlON phosphor to the $Eu^{2+}$-activated β-SiAlON phosphor is from 20 to 75.

BRIEF DESCRIPTION OF THE DRAWINGS

FIG. 8 is a table showing the mixing ratio of two green phosphors, the mixing ratio of the green phosphors to a red phosphor, and the mixing ratio of all phosphors to a dispersion medium (resin) in the light-emitting devices of the Examples according to the first embodiment and a light-emitting device of a Comparative Example and the measured luminous flux (relative value) of the light-emitting devices;

FIG. 9A is an exploded perspective view of an image display apparatus according to a second embodiment, and FIG. 9B is an exploded perspective view of a liquid crystal display device in the image display apparatus shown in FIG. 9A;

FIG. 10 is a table showing the coverage, the percent area, and the chromaticity coordinates of image display apparatuses of Examples according to the second embodiment and an image display apparatus of a Comparative Example; and FIG. 11 is a table showing the peak wavelength of a light-emitting element, the mixing ratio of two green phosphors, the mixing ratio of the green phosphors to a red phosphor, and the mixing ratio of all phosphors to a dispersion medium (resin) in light-emitting devices of Examples according to a third embodiment and the measured luminous flux (relative value) of the light-emitting devices.

DESCRIPTION OF THE EMBODIMENTS

First Embodiment

A first embodiment of the present disclosure will now be described with reference to FIGS. 1 to 8. The following description is directed toward a light-emitting device 10 that can achieve both a wide color gamut and high luminous efficiency through the use of a combination of two green phosphors 12a and 12b as green phosphors that are excited by blue light to emit green light.

Light-Emitting Device 10

Figure 1:
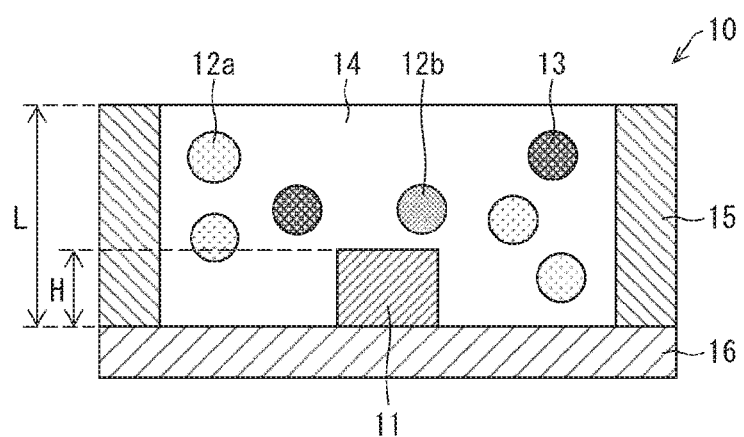
FIG. 1 is a sectional view of a light-emitting device according to a first embodiment.

FIG. 1 is a sectional view of the light-emitting device 10. As shown in FIG. 1, the light-emitting device 10 includes a light-emitting element 11 that emits blue light, two green phosphors 12a and 12b that are excited by the blue light to emit green light, a red phosphor 13 that is excited by the blue light to emit red light, a dispersion medium 14 in which the green phosphors 12a and 12b and the red phosphor 13 are dispersed, a resin frame 15, and a printed wiring board 16.

The green phosphor 12a used in the light-emitting device 10 is a $Mn^{2+}$-activated γ-AlON phosphor, whereas the green phosphor 12b used in the light-emitting device 10 is a $Eu^{2+}$-activated β-SiAlON phosphor. The weight ratio of the $Mn^{2+}$-activated γ-AlON phosphor to the $Eu^{2+}$-activated β-SiAlON phosphor is from 20 to 75. The weight ratio may be from 20 to 40 to reduce the amount of phosphor dispersed in the dispersion medium and thereby improve the suitability for mass production of the light-emitting device 10, whereas the weight ratio may be from 45 to 75 to more stably achieve a sufficiently wide color gamut.

Emission and absorption transitions of $Mn^{2+}$, which serves as a luminescent element in $Mn^{2+}$-activated γ-AlON phosphors, are both spin- and parity-forbidden; therefore, it has a much lower transition probability than luminescent elements that undergo allowed transitions, such as $Eu^{2+}$. When a $Mn^{2+}$-activated γ-AlON phosphor with low transition probability is used alone as a green phosphor, a large amount of phosphor may be dispersed in a dispersion medium to achieve sufficient light absorbance. However, an excessive proportion of phosphor particles relative to the dispersion medium decreases the light output efficiency and therefore decreases the luminous efficiency of the light-emitting device because of light loss due to, for example, excessive scattering of light by phosphor particles. According to this embodiment, a mixture of a $Mn^{2+}$-activated γ-AlON phosphor and a $Eu^{2+}$-activated β-SiAlON phosphor, which has high transition probability, can be used to effectively reduce the amount of phosphor used, as compared to a situation where a $Mn^{2+}$-activated γ-AlON phosphor is used alone. This alleviates excessive scattering of light and therefore reduces light loss, thus improving the luminous efficiency of the light-emitting device 10.

A weight ratio of the $Mn^{2+}$-activated γ-AlON phosphor to the $Eu^{2+}$-activated β-SiAlON phosphor of more than 75 does not result in an effective reduction in the amount of $Mn^{2+}$-activated γ-AlON used and thus does not result in an improvement in the luminous efficiency of the light-emitting device 10. A weight ratio of the $Mn^{2+}$-activated γ-AlON phosphor to the $Eu^{2+}$-activated β-SiAlON phosphor of less than 20 results in a narrow color gamut of the image display apparatus.

To reduce the size of the light-emitting device 10 according to this embodiment, the resin frame 15 of the light-emitting device 10 may have a depth (L in FIG. 1) of less than 1 mm. If the resin frame 15 has a depth of less than 1 mm, the production costs of the light-emitting device 10 can be reduced. In addition, when such a light-emitting device 10 is used for an image display apparatus, the flexibility of the optical design of the image display apparatus can be improved.

Small light-emitting devices are less suitable for mass production with stable quality than larger light-emitting devices since the yield tends to decrease; however, the decrease in yield can be alleviated by reducing the total amount of phosphor added to the dispersion medium and thereby reducing the fluidity of the dispersion medium through the use of a combination of a $Mn^{2+}$-activated γ-AlON phosphor and a $Eu^{2+}$-activated β-SiAlON phosphor. As a result, a small light-emitting device suitable for mass production with stable quality can be provided even if its resin frame has a depth of less than 1 mm.

In this embodiment, for example, L is 0.9 mm. In addition, the height of the light-emitting element 11, H, is 0.1 mm. In this case, the shortest length of the optical path formed by the blue light emitted from the light-emitting element 11 as it passes through the dispersion medium 14 in the light-emitting device 10 is calculated to be 0.8 mm. Thus, the shortest length of the optical path formed by the blue light as it passes through the dispersion medium 14 in the light-emitting device 10 according to this embodiment is not more than 1 mm. That is, the light-emitting device 10 is provided as a small light-emitting device in which the shortest length described above is not more than 1 mm.

Light-Emitting Element 11

The light-emitting element 11 is a light-emitting element that emits blue light. The light-emitting element 11 may be any light-emitting element that emits primary light (excitation light) that is composed of blue light and that a phosphor absorbs to emit fluorescence. For example, the light-emitting element 11 may be a gallium nitride (GaN)-based semiconductor light-emitting element.

The primary light (excitation light) emitted from the light-emitting element 11 preferably has a peak wavelength of from 440 nm to 460 nm, more preferably from 440 nm to 450 nm. If the primary light (excitation light) emitted from the light-emitting element 11 has a peak wavelength of from 440 nm to 460 nm, the excitation efficiency of the green phosphors 12a ($Mn^{2+}$-activated γ-AlON phosphor) and 12b ($Eu^{2+}$-activated β-SiAlON phosphor) can be increased. Accordingly, the light-emitting element 11 has high luminous efficiency. In addition, there is a good wavelength match between the emission spectrum of the primary light and the transmission spectrum of a blue color filter 126b shown in FIGS. 3 and 9B. Thus, the luminous efficiency of the light-emitting device 10 can be improved to such an extent as to achieve the desired luminous efficiency that can be achieved by an image display apparatus according to an aspect of the present disclosure.

Since the excitation efficiency of the green phosphor 12a can be increased within the above wavelength range, the amount of green phosphor 12a used in the light-emitting device 10 can be reduced. This alleviates a decrease in the luminous efficiency of the light-emitting device 10 due to excessive scattering of light as discussed above and also alleviates a decrease in the yield and suitability for mass production of the light-emitting device 10 due to a decrease in the fluidity of the dispersion medium 14.

If the peak wavelength is from 440 nm to 450 nm, the excitation efficiency of the green phosphor 12a can be further increased. Accordingly, the luminous efficiency of the light-emitting device 10 can be further improved.

Figure 3:
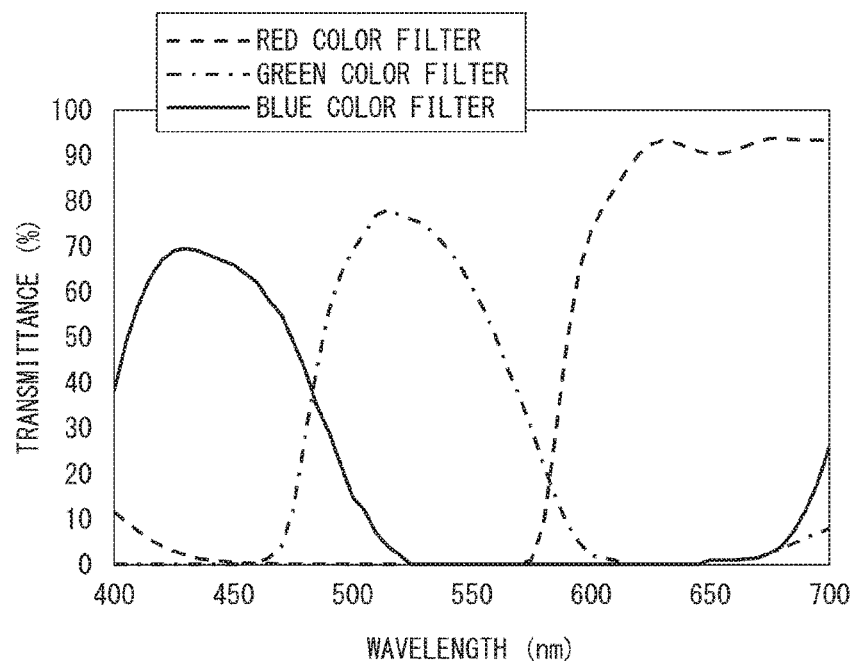
FIG. 3 is a graph showing the transmission spectra of color filters.
Figure 4:
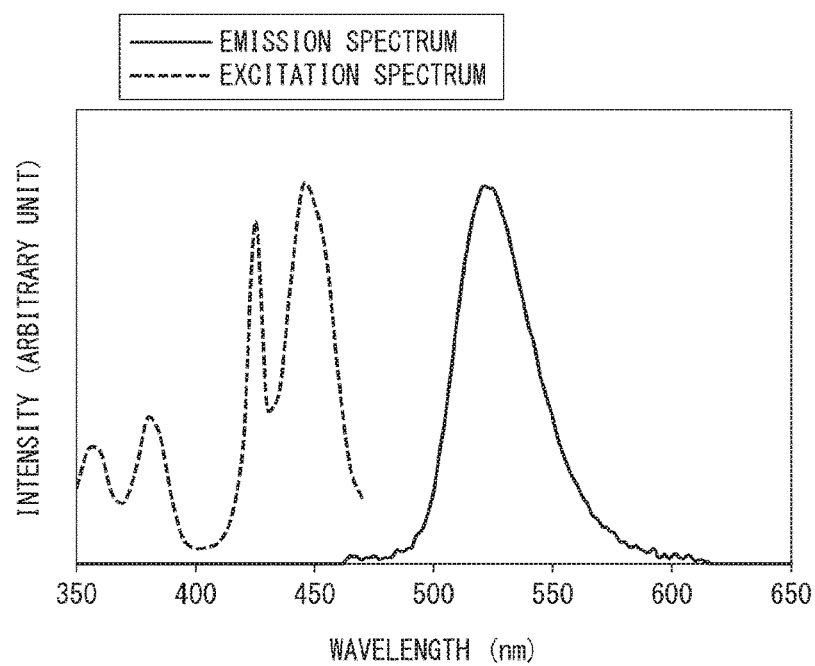
FIG. 4 is a graph showing the emission and excitation spectra of a green phosphor of Production Example G1.
Figure 6:
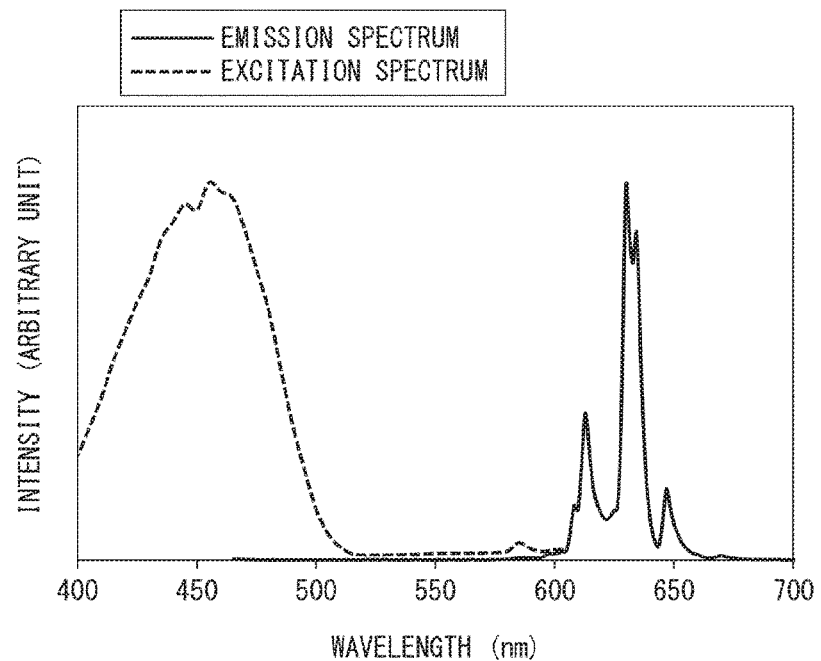
FIG. 6 is a graph showing the emission and excitation spectra of a red phosphor of Production Example R1.

If the peak wavelength is from 440 nm to 460 nm, preferably from 440 nm to 450 nm, there is a good wavelength match between the emission spectrum of the primary light and the excitation spectrum of the green phosphor 12a shown in FIG. 4, the excitation spectrum of the red phosphor 13 shown in FIG. 6, and the transmission spectrum of the blue color filter 126b shown in FIG. 3. Thus, if the peak wavelength is from 440 nm to 460 nm, preferably from 440 nm to 450 nm, the luminous efficiency of the light-emitting device 10, which emits white light, can be improved.

Green Phosphor 12a: $Mn^{2+}$-Activated γ-AlON Phosphor

The $Mn^{2+}$-activated γ-AlON phosphor used as the green phosphor 12a in this embodiment is represented by the composition formula $M_aA_bAl_cO_dN_e$ (where M is one or more metal elements selected from Mn, Ce, Pr, Nd, Sm, Eu, GD, Tb, Dy, Tm, and Yb, with the proviso that at least Mn is included; A is one or more metal elements other than M and Al; and a+b+c+d+e=1). Examples of $Mn^{2+}$-activated γ-AlON phosphors that may be used include those having compositions satisfying all of conditions (1) to (5):

$$0.00001 \leq a \leq 0.1 \quad (1)$$

$$0 \leq b \leq 0.40 \quad (2)$$

$$0.10 \leq c \leq 0.48 \quad (3)$$

$$0.25 \leq d \leq 0.60 \quad (4)$$

$$0.02 \leq e \leq 0.35 \quad (5)$$

$Mn^{2+}$ contributes to the absorption of excitation light and the emission of light in $Mn^{2+}$-activated γ-AlON phosphors. However, absorption and emission transitions of $Mn^{2+}$ are both spin- and parity-forbidden; therefore, it has low transition probability. Accordingly, when a $Mn^{2+}$-activated γ-AlON phosphor is used alone as a green phosphor, a large amount of $Mn^{2+}$-activated γ-AlON phosphor may be dispersed in the dispersion medium by taking into account the balance with blue and red light so that the light-emitting device emits white light. However, an excessive amount of phosphor dispersed in the dispersion medium causes light loss, that is, diffusion and escape of light to the surrounding area, due to excessive scattering of light by phosphor particles. As a result, a problem arises in that the light-emitting device has considerably decreased luminous efficiency.

Another problem resulting from an excessive amount of phosphor is a possible decrease in the fluidity of the dispersion medium. This may cause clogging of a dispenser for applying the dispersion medium in which the phosphor is dispersed and may also cause variations in the chromaticity of light emitted from individual light-emitting devices. Thus, a decrease in the fluidity of the dispersion medium may decrease the yield of the light-emitting device and may therefore decrease the suitability of the light-emitting device for mass production with stable quality.

Thus, to improve the luminous efficiency of light-emitting devices and to manufacture light-emitting devices in high yield, it is desirable to develop a technique for reducing the amount of $Mn^{2+}$-activated γ-AlON phosphor dispersed in the dispersion medium. One approach to reduce the amount of $Mn^{2+}$-activated γ-AlON phosphor dispersed is to stably incorporate more Mn into the γ-AlON crystals.

When a $Mn^{2+}$-activated γ-AlON phosphor is used for a light-emitting device, the γ-AlON crystals may have a Mn concentration of from 1.5% to 4.6% by weight. If the Mn concentration is less than 1.5% by weight, it is difficult to achieve emission of white light with a common LED package because of insufficient green light. To stably incorporate more Mn into the γ-AlON crystals, it is preferred to add a divalent metal element such as Mg, Zn, or Ca, particularly preferably Mg, as A in the composition formula $M_aA_bAl_cO_dN_e$. The presence of Mg in the $Mn^{2+}$-activated γ-AlON phosphor stabilizes the crystal structure of the γ-AlON crystals and thus allows more Mn to be incorporated into the crystals. This improves the absorbance and luminous efficiency of the $Mn^{2+}$-activated γ-AlON phosphor. However, if the Mn concentration is more than 4.6% by weight, the $Mn^{2+}$-activated γ-AlON phosphor may have decreased luminous efficiency due to, for example, concentration quenching and decreased crystallinity.

Another problem resulting from increased Mn concentration lies in that the full width at half maximum of the emission spectrum tends to increase with increasing Mn concentration. The use of a $Mn^{2+}$-activated γ-AlON phosphor having an emission spectrum with a full width at half maximum of from 35 nm to 45 nm is effective in achieving a sufficiently high BT.2020 coverage.

Any technique may be used to obtain a $Mn^{2+}$-activated γ-AlON phosphor having an emission spectrum with a full width at half maximum within this range. For example, this can be achieved by controlling the concentration of Mn present in the γ-AlON crystals to from 1.5% to 4.6% by weight, particularly to 3% by weight or less.

The concentration of Mn incorporated into the crystals is an indicator different from the Mn concentration of the design composition determined from the mixing ratio of raw material powders. Specifically, the concentration of Mn present in the $Mn^{2+}$-activated γ-AlON phosphor refers to the concentration of Mn incorporated into the $Mn^{2+}$-activated γ-AlON phosphor crystals in the finished product. Mn, which is highly volatile, is readily volatilized and incorporated into the glass or other phase outside the γ-AlON crystals during a high-temperature firing process. Thus, the indicator used as the concentration of Mn that is actually incorporated into the γ-AlON crystals and that contributes to emission may be, for example, the Mn concentration directly measured in cross-sections of the $Mn^{2+}$-activated γ-AlON phosphor crystals, rather than the Mn concentration determined from the design composition. That is, the concentration of Mn actually incorporated into the crystals may be determined and used as the indicator.

The concentration of Mn present in the green phosphor crystals can be calculated, for example, as follows. A phosphor powder is first dispersed in an epoxy resin (G-2 available from JEOL Ltd.). The epoxy resin having the phosphor powder dispersed therein is then irradiated with an Ar ion beam using a cross-section preparation system (SM-09010 available from JEOL Ltd.) to cut the phosphor particles embedded in the epoxy resin. The cut surfaces of a plurality of (e.g., 50 or more) phosphor particles are then analyzed for Mn concentration using an energy-dispersive X-ray spectrometry (EDX) detector (G-XM2 energy-dispersive X-ray spectrometer available from Ametek, Inc.) associated with a scanning electron microscope (SEM), and the average Mn concentration is calculated.

The $Mn^{2+}$-activated γ-AlON phosphor may have an emission spectrum with a peak wavelength of from 520 nm to 527 nm. If the $Mn^{2+}$-activated γ-AlON phosphor used in the light-emitting device 10 has an emission spectrum with a peak wavelength within this range, the coverage of the BT.2020 color gamut tends to improve, and the color gamut of the image display apparatus can be expanded.

Green Phosphor 12b: $Eu^{2+}$-Activated β-SiAlON Phosphor

The $Eu^{2+}$-activated β-SiAlON phosphor used as the green phosphor 12b in this embodiment may be a matrix material represented by the general formula $Si_{6-z}Al_zO_zN_{8-z}$ (where 0<z<4.2) and activated (doped) with Eu in a concentration of 4% by weight or less. To increase the luminous efficiency of the phosphor, the Eu concentration may be 2% by weight or less.

As discussed above, $Eu^{2+}$-activated β-SiAlON phosphors can be used (mixed) in much smaller amounts than $Mn^{2+}$-activated γ-AlON phosphors to efficiently absorb excitation light since $Eu^{2+}$, which serves as a luminescent element in $Eu^{2+}$-activated β-SiAlON phosphors, undergoes allowed transitions. Thus, the use of a mixture of a $Mn^{2+}$-activated γ-AlON phosphor and a $Eu^{2+}$-activated β-SiAlON phosphor alleviates the problem resulting from the use of a $Mn^{2+}$-activated γ-AlON phosphor alone, i.e., a decrease in the luminous efficiency of a light-emitting device due to an increased amount of phosphor used (mixed).

The emission spectra of the $Mn^{2+}$-activated γ-AlON phosphor and the $Eu^{2+}$-activated β-SiAlON phosphor may be as close in shape to each other as possible. Specifically, it is preferred to use a $Eu^{2+}$-activated β-SiAlON phosphor having an emission spectrum with a peak wavelength of from 525 nm to 535 nm, more preferably 530 nm or less, and a full width at half maximum of from 45 nm to 52 nm.

The emission spectrum of the $Eu^{2+}$-activated β-SiAlON phosphor can be controlled by changing the value of z in the above general formula. The value of z may be less than 0.1. A $Eu^{2+}$-activated β-SiAlON phosphor where z is less than 0.1 has an emission spectrum with a shorter peak wavelength, and the shorter-wavelength side of the emission spectrum is closer in shape to that of the $Mn^{2+}$-activated γ-AlON phosphor.

If z is 0.1 or more, for example, 0.24, the emission spectrum of the $Eu^{2+}$-activated β-SiAlON phosphor has a peak wavelength of 540 nm, which is much longer than that of the $Mn^{2+}$-activated γ-AlON phosphor. In this case, even if the $Mn^{2+}$-activated γ-AlON phosphor is mixed with the $Eu^{2+}$-activated β-SiAlON phosphor, the large difference in shape between the emission spectra of the $Mn^{2+}$-activated γ-AlON phosphor and the $Eu^{2+}$-activated β-SiAlON phosphor may make it difficult to sufficiently achieve both an effective reduction in the amount of $Mn^{2+}$-activated γ-AlON phosphor used and the expansion of the color gamut of the image display apparatus.

Red Phosphor 13

The red phosphor 13 is a wavelength-converting material that is excited by the blue light emitted from the light-emitting element 11 to emit red light. An example of such a red phosphor is a $Mn^{4+}$-activated phosphor. A suitable $Mn^{4+}$-activated phosphor may be selected from $Mn^{4+}$-activated fluoride complex phosphors, $Mn^{4+}$-activated oxide phosphors, $Mn^{4+}$-activated oxyfluoride phosphors, and the like. In particular, a $Mn^{4+}$-activated fluoride complex phosphor may be used. $Mn^{4+}$-activated fluoride complex phosphors have superior color reproduction performance in the red region since red light emitted therefrom has an emission spectrum with a small full width at half maximum, for example, 10 nm or less. $Mn^{4+}$-activated fluoride complex phosphors also have high excitation efficiency for blue light.

The luminescent element used herein, i.e., $Mn^{4+}$, is the same element as $Mn^{2+}$ in the green phosphor 12a, namely, Mn; however, they have different valences and therefore different emission mechanisms. Specifically, as described above, transitions of $Mn^{2+}$ are both spin- and parity-forbidden; although transitions of $Mn^{4+}$ are also parity-forbidden, only absorption transitions of $Mn^{4+}$ are spin-allowed. Thus, the amount of $Mn^{4+}$-activated phosphor used is larger than, for example, the amount of $Eu^{2+}$-activated phosphor (its transitions are both spin- and parity-allowed) used, but is smaller than the amount of $Mn^{2+}$-activated phosphor used.

The $Mn^{4+}$-activated fluoride complex phosphor used as the red phosphor 13 may be, for example, a phosphor represented by general formula (A) or (B) below. As discussed above, the $Mn^{4+}$-activated fluoride complex phosphor, irrespective of being represented by general formula (A) or (B), has an emission spectrum with a very small full width at half maximum, i.e., 10 nm or less. This is attributed to the properties of the luminescent ion, namely, $Mn^{4+}$.

General formula (A): $MI_2 (MII_{1-h}Mn_h)F_6$ where MI is at least one alkali metal element selected from the group consisting of Li, Na, K, Rb, and Cs; MII is at least one tetravalent metal element selected from the group consisting of Ge, Si, Sn, Ti, and Zr; and h may satisfy $0.001 \leq h \leq 0.1$.

In general formula (A), MI may be K, which gives a phosphor with high emission intensity and high crystal stability. For the same reason, MII may include Ti or Si.

In general formula (A), the value of h indicates the composition ratio (concentration) of Mn, i.e., the concentration of $Mn^{4+}$. If the value of h is less than 0.001, a problem arises in that the phosphor has insufficient brightness because of the insufficient concentration of the luminescent ion, namely, $Mn^{4+}$. If the value of h is more than 0.1, a problem arises in that the brightness decreases considerably because of, for example, concentration quenching.

Thus, the $Mn^{4+}$-activated fluoride complex phosphor represented by general formula (A) may be $K_2(Ti_{1-h}Mn_h)F_6$ or $K_2(Si_{1-h}Mn_h)F_6$, where h may be from 0.001 to 0.1.

General formula (B): $MIII(MII_{1-h}Mn_h)F_6$ where MIII is at least one alkaline earth metal element selected from the group consisting of Mg, Ca, Sr, and Ba; MII is at least one tetravalent metal element selected from the group consisting of Ge, Si, Sn, Ti, and Zr; and h may satisfy $0.001 \leq h \leq 0.1$.

In general formula (B), MIII may include at least Ba, which gives a phosphor with high luminous efficiency and less susceptibility to heat and external force. For the same reason, MII may include Ti or Si.

In particular, if MII is Si, the $Mn^{4+}$-activated fluoride complex phosphor, irrespective of being represented by general formula (A) or (B), has low solubility in water and therefore has high water resistance. In general formula (B), the value of h, which indicates the composition ratio (concentration) of Mn, may satisfy $0.001 \leq h \leq 0.1$, as in general formula (A) above.

Dispersion Medium 14

The dispersion medium 14 is a medium in which phosphors are dispersed. In this embodiment, the dispersion medium 14 fills the interior of the resin frame 15. As shown in FIG. 1, the dispersion medium 14 has dispersed therein at least the green phosphor 12a, which is a $Mn^{2+}$-activated γ-AlON phosphor, the green phosphor 12b, which is a $Eu^{2+}$-activated β-SiAlON phosphor, and the red phosphor 13. The light-emitting element 11 is sealed with the dispersion medium 14 in which the phosphors are dispersed.

Examples of materials suitable for use as the dispersion medium 14 include, but are not limited to, light-transmissive resin materials such as methyl silicone resins, phenyl silicone resins, epoxy resins, and acrylic resins; glass materials such as low-melting-point glasses; and organic-inorganic hybrid glasses. In particular, if the dispersion medium 14 is made of a resin material, the dispersion medium 14 can be produced at a lower temperature than other materials.

In this embodiment, a γ-AlON phosphor activated with $Mn^{2+}$, which has low emission and absorption transition probability, as a luminescent element is used in the small light-emitting device 10, in which the shortest length of the optical path described above (i.e., (depth L of resin frame 15)−(height H of light-emitting element 11)) is not more than 1 mm. Thus, as discussed above, the fluidity of the dispersion medium 14 containing the phosphors may decrease unless the amount of $Mn^{2+}$-activated γ-AlON phosphor mixed is appropriately controlled.

From this viewpoint, the ratio of the total weight of the phosphors (the sum of the weights of the phosphors) to the weight of the dispersion medium 14 may be 1.2 or less, that is, (total weight of phosphors)/(weight of dispersion medium 14)≤1.2, at least to alleviate the decrease in the fluidity of the dispersion medium 14. This alleviates the decrease in the fluidity of the dispersion medium 14 having the phosphors dispersed therein and thus improves the yield and suitability for mass production of the light-emitting device 10.

The weight ratio may be 1.0 or less, that is, (total weight of phosphors)/(weight of dispersion medium 14)≤1.0. This further alleviates the decrease in fluidity.

The weight ratio may be more than 0.3, that is, (total weight of phosphors)/(weight of dispersion medium 14)>0.3. If the weight ratio is more than 0.3, the chromaticity point of the light emitted from the light-emitting device 10 (e.g., white light) can be controlled to a range suitable for an image display apparatus according to an aspect of the present disclosure.

Other Components of Light-Emitting Device 10

The printed wiring board 16 is a board on which the light-emitting element 11 is mounted and an electrical circuit for driving the light-emitting element 11 is formed. The resin frame 15 is a frame formed of a resin and mounted on the printed wiring board 16.

Production of Phosphors

Production Example G1: Example of Production of $Mn^{2+}$-Activated γ-AlON Phosphor To prepare a $Mn^{2+}$-activated γ-AlON phosphor, predetermined amounts of raw material powders were weighed according to the following composition: 10.70% by weight of aluminum nitride powder, 79.86% by weight of aluminum oxide powder, 4.68% by weight of magnesium oxide powder, and 4.76% by weight of manganese fluoride powder. These powders were then mixed together using a sintered silicon nitride mortar and pestle for 10 minutes or more to obtain a powder aggregate. This powder aggregate was allowed to fall into a boron nitride crucible with a diameter of 20 mm and a height of 20 mm.

The crucible was then set in a graphite-resistance-heating pressure electric furnace. After nitrogen with a purity of 99.999% by volume was introduced into the pressure electric furnace until the internal pressure thereof was 0.5 MPa, the crucible was heated to 1,800° C. at a heating rate of 500° C. per hour. The crucible was then maintained at 1,800° C. in the pressure electric furnace for 2 hours to obtain a phosphor sample.

The resulting phosphor sample was wet-ground with a small amount of pure water in an agate mortar and was passed multiple times through a sieve with an opening size of 48 μm to remove coarse powder while grinding the phosphor sample. The phosphor sample having coarse powder removed therefrom was then dispersed in a solution of 0.1% by weight hexametaphosphoric acid in pure water. After the dispersion was allowed to stand for a predetermined period of time, the supernatant was discarded to remove fine powder. A phosphor powder of controlled particle size was obtained.

The resulting phosphor powder was analyzed by powder X-ray diffraction (XRD) with Cu Kα radiation. As a result, it was found that all charts obtained from the phosphor powder showed that the phosphor powder had a γ-AlON structure. It was also found that the phosphor powder emitted green light when irradiated with light having a wavelength of 365 nm. Thus, a $Mn^{2+}$-activated γ-AlON phosphor powder of Production Example G1 was obtained through the foregoing process.

The emission spectrum shown in FIG. 4 was then obtained by irradiating the resulting $Mn^{2+}$-activated γ-AlON phosphor of Production Example G1 with light having a wavelength of 445 nm. The excitation spectrum shown in FIG. 4 was also obtained by monitoring the peak wavelength of the emission spectrum. In FIG. 4, the vertical axis indicates the emission intensity (arbitrary unit), whereas the horizontal axis indicates the wavelength (nm). The emission spectrum shown in FIG. 4 had a peak wavelength of 522 nm, a full width at half maximum of 38 nm, and chromaticity coordinates of (CIEx, CIEy)=(0.204, 0.721). The $Mn^{2+}$-activated γ-AlON phosphor of Production Example G1 also had an internal quantum efficiency of 60% as measured using a measurement system composed of an MCPD-7000 (available from Otsuka Electronics Co., Ltd.) and an integrating sphere.

Production Example G2: Example of Production of $Eu^{2+}$-Activated β-SiAlON Phosphor A $Eu^{2+}$-activated β-SiAlON phosphor represented by the composition formula $Si_{6-z}Al_zO_zN_{8-z}$ where z=0.05 and activated with 0.7% by weight of Eu was prepared by the following procedure. First, predetermined amounts of raw material powders passed through a 45 μm sieve were weighed according to the following composition: 93.59% by weight of metallic Si powder, 5.02% by weight of aluminum nitride powder, and 1.39% by weight of europium oxide powder. These powders were mixed together using a sintered silicon nitride mortar and pestle for 10 minutes or more to obtain a powder aggregate. This powder aggregate was allowed to fall into a boron nitride crucible with a diameter of 20 mm and a height of 20 mm.

The crucible was then set in a graphite-resistance-heating pressure electric furnace. The firing atmosphere was evacuated with a diffusion pump. The crucible was heated from room temperature to 800° C. at a rate of 500° C. per hour. Nitrogen with a purity of 99.999% by volume was introduced at 800° C. until the pressure was 0.5 MPa. The crucible was heated to 1,300° C. at a rate of 500° C. per hour, was heated to 1,600° C. at a rate of 1° C. per minute, and was maintained at that temperature for 8 hours. The resulting sample was ground to a powder in an agate mortar to obtain a powder sample.

This powder was then subjected to heating treatment again. After the powder fired at 1,600° C. was ground using a silicon nitride mortar and pestle, the powder was allowed to fall into a boron nitride crucible with a diameter of 20 mm and a height of 20 mm.

The crucible was set in a graphite-resistance-heating pressure electric furnace. The firing atmosphere was evacuated with a diffusion pump. The crucible was heated from room temperature to 800° C. at a rate of 500° C. per hour. After nitrogen with a purity of 99.999% by volume was introduced at 800° C. until the pressure was 1 MPa, the crucible was heated to 1,900° C. at a rate of 500° C. per hour and was maintained at that temperature for 8 hours to obtain a phosphor sample. The resulting phosphor sample was ground in an agate mortar and was treated with a 1:1 mixture of 50% hydrofluoric acid and 70% nitric acid at 60° C. The treated sample was then dispersed in a solution of 0.1% by weight hexametaphosphoric acid in pure water. After the dispersion was allowed to stand for a predetermined period of time, the supernatant was discarded to remove fine powder. A phosphor powder of controlled particle size was obtained.

The resulting phosphor powder was analyzed by powder X-ray diffraction with Cu Kα radiation. As a result, it was found that all charts obtained from the phosphor powder showed that the phosphor powder had a β-SiAlON structure. It was also found that the phosphor powder emitted green light when irradiated with a lamp that emitted light having a wavelength of 365 nm.

Figure 5:
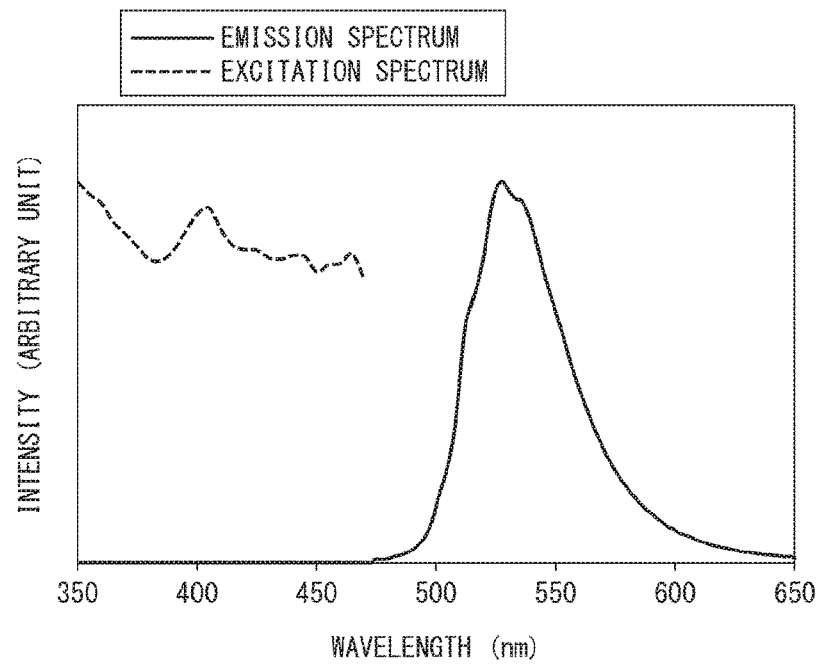
FIG. 5 is a graph showing the emission and excitation spectra of a green phosphor of Production Example G2.

The emission spectrum of the resulting $Eu^{2+}$-activated β-SiAlON phosphor powder was measured. As a result, the emission spectrum shown in FIG. 5 was obtained. The excitation spectrum shown in FIG. 5 was also obtained by monitoring the peak wavelength of the emission spectrum. In FIG. 5, the vertical axis indicates the emission intensity (arbitrary unit), whereas the horizontal axis indicates the wavelength (nm). The emission spectrum shown in FIG. 5 had chromaticity coordinates of (CIEx, CIEy)=(0.280, 0.676), a peak wavelength of 527 nm, and a full width at half maximum of 47 nm. The $Eu^{2+}$-activated β-SiAlON phosphor of Production Example G2 also had an internal quantum efficiency of 56% as measured using a measurement system composed of an MCPD-7000 and an integrating sphere.

Production Example R1: Preparation of $Mn^{4+}$-Activated $K_2SiF_6$ Phosphor

A $Mn^{4+}$-activated fluoride complex phosphor represented by composition formula (A) above, i.e., $MI_2(MII_{1-h}Mn_h)F_6$, where MI was K, MII was Si, and h=0.06 was prepared by the following procedure.

A fluorocarbon resin ion exchange membrane partition (diaphragm) was first placed in the center of a vinyl chloride resin reaction vessel. A platinum plate anode was placed in one of the two chambers separated by the ion exchange membrane, whereas a platinum plate cathode was placed in the other chamber. An aqueous hydrofluoric acid solution having manganese(II) fluoride dissolved therein was poured into the anode side of the reaction vessel, whereas an aqueous hydrofluoric acid solution was poured into the cathode side of the reaction vessel.

The anode and the cathode were connected to a power supply, and electrolysis was performed at a voltage of 3 V and a current of 0.75 A. Upon completion of electrolysis, an excess of a saturated solution of potassium fluoride in aqueous hydrofluoric acid solution was added to the reaction solution on the anode side to yield $K_2MnF_6$ as a yellow solid product. The resulting yellow solid product was filtered off and collected to obtain $K_2MnF_6$.

An aqueous solution containing silicon fluoride was then prepared by dissolving 4.8 g of silicon dioxide in 100 cm$^3$ of 48% by weight aqueous hydrofluoric acid solution. After the aqueous solution was allowed to cool to room temperature, the aqueous solution was placed in a resin container with a lid and was warmed in a water bath maintained at 70° C. for 1 hour or more. To the aqueous solution containing silicon fluoride, 1.19 g of the $K_2MnF_6$ powder prepared as described above was added and dissolved with stirring to obtain an aqueous solution containing silicon fluoride and $K_2MnF_6$ (first solution).

An aqueous solution containing potassium fluoride (second solution) was then prepared by dissolving 13.95 g of potassium fluoride in 40 cm$^3$ of 48% by weight aqueous hydrofluoric acid solution and allowing the solution to cool to room temperature.

The second solution was then gradually added to the stirred first solution over about 2.5 minutes, followed by stirring for about 10 minutes to obtain a pale orange solid. This solid product was filtered off and washed with a small amount of 20% by weight aqueous hydrofluoric acid solution. The solid product was then washed with ethanol and was dried in a vacuum. As a result, a $Mn^{4+}$-activated $K_2SiF_6$ phosphor powder of Production Example R1 was obtained.

The resulting phosphor powder was analyzed by powder X-ray diffraction (XRD) with Cu Kα radiation. As a result, it was found that all charts obtained from the phosphor powder showed that the phosphor powder had a $K_2SiF_6$ structure. It was also found that the phosphor powder emitted red light when irradiated with light having a wavelength of 365 nm.

The emission spectrum shown in FIG. 6 was then obtained by irradiating the resulting red phosphor 13 of Production Example R1 with light having a wavelength of 445 nm. The excitation spectrum shown in FIG. 6 was also obtained by monitoring the peak wavelength of the emission spectrum. Specifically, the emission spectrum was measured by irradiating the red phosphor 13 with light having a wavelength of 445 nm using a spectrophotometer to excite the red phosphor. The emission spectrum shown in FIG. 6 had a peak wavelength of 630 nm and a full width at half maximum of 8 nm. The chromaticity coordinates in the CIE 1931 chromaticity diagram calculated from the emission spectrum were (CIEx, CIEy)=(0.691, 0.307).

Examples D1 to D4

Examples of the production of light-emitting devices 10 according to this embodiment (Examples D1 to D4) will now be described with reference to FIGS. 1, 7A to 7D, and 8.

The light-emitting devices 10 of Examples D1 to D4 had the structure shown in FIG. 1. The light-emitting elements 11 used in the light-emitting devices 10 of Examples D1 to D4 were blue LEDs (available from Cree, Inc.) having an emission peak wavelength of 445 nm. The green phosphor 12a was the $Mn^{2+}$-activated γ-AlON phosphor obtained in Production Example G1 above. The green phosphor 12b was the $Eu^{2+}$-activated β-SiAlON phosphor obtained in Production Example G2 above. The dispersion medium 14 was a silicone resin (KER-2500 available from Shin-Etsu Chemical Co., Ltd.). The red phosphor 13 was the $Mn^{4+}$-activated $K_2SiF_6$ phosphor obtained in Production Example R1 above.

As the phosphors to be dispersed in the silicone resin, the $Mn^{4+}$-activated $K_2SiF_6$ phosphor of Production Example R1 above, the $Mn^{2+}$-activated γ-AlON phosphor of Production Example G1 above, and the $Eu^{2+}$-activated β-SiAlON phosphor of Production Example G2 above were mixed in the weight ratios shown in FIG. 8 to obtain phosphor mixtures.

These phosphor mixtures were then dispersed in the silicone resin to obtain phosphor-dispersed resins. Specifically, these phosphor-dispersed resins were obtained by mixing the phosphor mixtures with the silicone resin in the weight ratios shown in FIG. 8.

FIG. 8 shows the ratios of the total weight of the phosphors (i.e., the sum of the weights of the green phosphors 12a and 12b and the red phosphor 13) to the weight of the silicone resin (dispersion medium 14). The resulting phosphor-dispersed resins were then kneaded in a planetary centrifugal mixer (AR-100 available from Thinky Corporation). The kneaded phosphor-dispersed resins were manually applied to the interiors of resin frames using a needle-like jig. The silicone resin was then cured by heating treatment at 150° C. to obtain light-emitting devices.

The resulting light-emitting devices were then driven at a drive current of 30 mA, and the emission spectrum was measured with a spectrophotometer (MCPD-7000). As a result, the emission spectra shown in FIGS. 7A to 7D were obtained. In Examples D1 to D4, the amounts of $Mn^{4+}$-activated $K_2SiF_6$ phosphor, $Mn^{2+}$-activated γ-AlON phosphor, and $Eu^{2+}$-activated β-SiAlON phosphor dispersed were adjusted as shown in FIG. 8 so that the chromaticity points indicating the white points of light having the emission spectra shown in FIGS. 7A to 7D after passage through a liquid crystal panel represented a white color with a color temperature of 10,000 K, which lies near (CIEx, CIEy)=(0.281, 0.288). The term "white point" refers to the chromaticity point on a display (screen) on which all light passing through a liquid crystal panel is simultaneously displayed.

Comparative Example D1

Figure 7A:
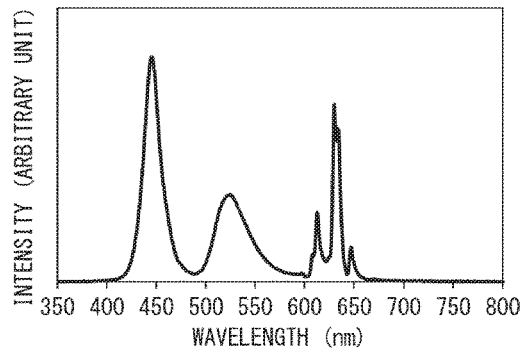
FIGS. 7A to 7D are graphs showing the emission spectra of light-emitting devices of Examples according to the first embodiment.
Figure 7D:
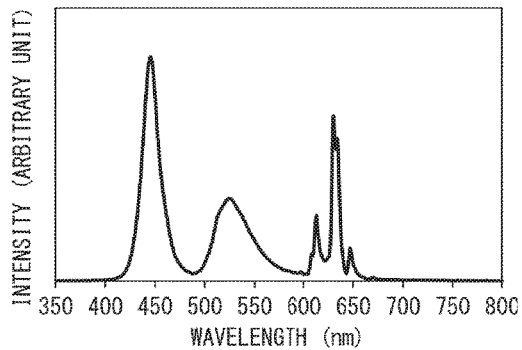
Figure 7B:
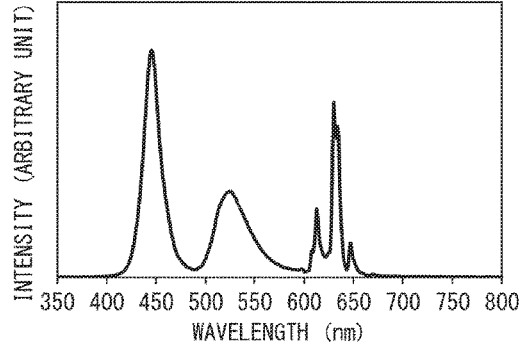
Figure 7E:
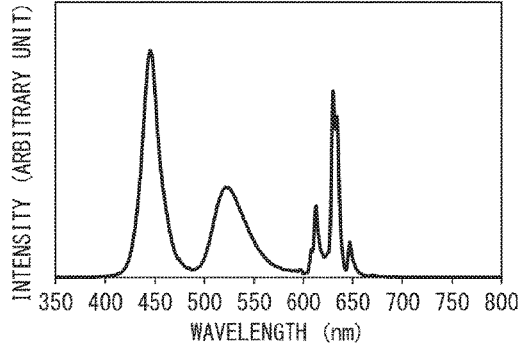
FIGS. 7E and 7F are graphs showing the emission spectra of light-emitting devices of Comparative Examples.
Figure 7C:
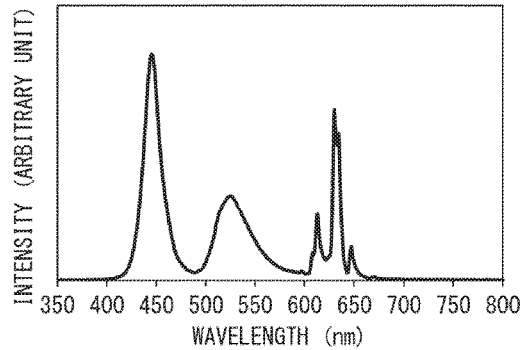

Next, an example of the production of a light-emitting device for comparison with the light-emitting device 10 according to this embodiment (Comparative Example D1) will be described with reference to FIGS. 2, 7E, and 8.

Figure 2:
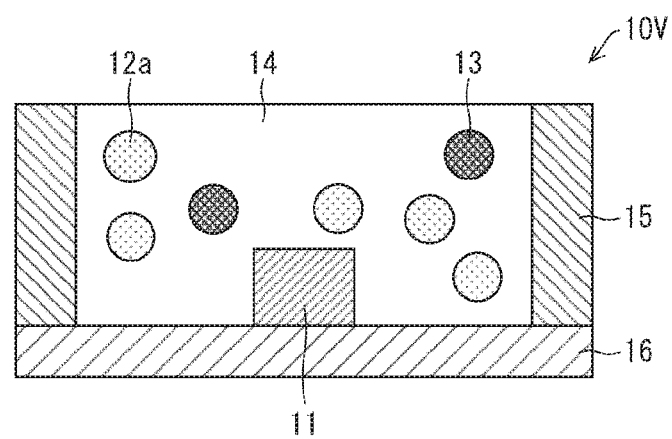
FIG. 2 is a sectional view of a light-emitting device of Comparative Example D1.

The light-emitting device of Comparative Example D1 had the same structure as a light-emitting device 10V having the structure shown in FIG. 2. The light-emitting device 10V has the same configuration as the light-emitting device 10 except that the green phosphor 12b ($Eu^{2+}$-activated β-SiAlON phosphor) is omitted.

The light-emitting element used in the light-emitting device of Comparative Example D1 was a blue LED having an emission peak wavelength of 445 nm. The green phosphor was the $Mn^{2+}$-activated γ-AlON phosphor obtained in Production Example G1 above alone. The dispersion medium 14 was a silicone resin (KER-2500). The red phosphor 13 was the $Mn^{4+}$-activated $K_2SiF_6$ phosphor obtained in Production Example R1 above.

As the phosphors to be dispersed in the silicone resin, the $Mn^{4+}$-activated $K_2SiF_6$ phosphor of Production Example R1 above and the $Mn^{2+}$-activated γ-AlON phosphor of Production Example G1 above were first mixed in the weight ratio shown in FIG. 8 to obtain a phosphor mixture.

This phosphor mixture was then dispersed in the silicone resin in the ratio shown in FIG. 8 to obtain a phosphor-dispersed resin. As in the Examples above, the procedure of applying the phosphor-dispersed resin was manually performed to obtain a light-emitting device.

The resulting light-emitting device was then driven at a drive current of 30 mA, and the emission spectrum was measured with a spectrophotometer (MCPD-7000). As a result, the emission spectrum shown in FIG. 7E was obtained. In Comparative Example D1, the amounts of $Mn^{4+}$-activated $K_2SiF_6$ phosphor and $Mn^{2+}$-activated γ-AlON phosphor dispersed were adjusted so that the chromaticity point indicating the white point of light having the emission spectrum shown in FIG. 7E after passage through a liquid crystal panel represented a white color with a color temperature of 10,000 K, which lies near (CIEx, CIEy)=(0.281, 0.288). As shown in FIG. 8, the chromaticity coordinates of the white point of the light emitted from the light-emitting device of Comparative Example D1 were (CIEx, CIEy)=(0.281, 0.288).

Evaluation of Light-Emitting Devices

The relative luminous flux (brightness) of the light emitted from the light-emitting devices of Examples D1 to D4 and Comparative Example D1 above and the suitability for mass production of the light-emitting devices will be compared with reference to FIG. 8. Light-emitting devices with higher relative luminous fluxes have higher luminous efficiencies for the same chromaticity point indicating the white point.

As shown in FIG. 8, a comparison between the luminous fluxes of the light-emitting devices reveals that the light-emitting devices 10 of Examples D1 to D4 had higher luminous fluxes than the light-emitting device 10V of Comparative Example D1. This indicates that the light-emitting devices 10 of Examples D1 to D4 had higher luminous efficiencies than the light-emitting device 10V of Comparative Example D1. The light-emitting devices 10 of the Examples differed from the light-emitting device 10V of the Comparative Example in that the light-emitting devices 10 of the Examples contained $Eu^{2+}$-activated β-SiAlON as a green phosphor.

The $Mn^{2+}$-activated γ-AlON phosphor of Production Example G1 had an internal quantum efficiency of 60%, whereas the $Eu^{2+}$-activated β-SiAlON phosphor of Production Example G2 had an internal quantum efficiency of 56%; thus, the $Mn^{2+}$-activated γ-AlON phosphor had a higher internal quantum efficiency. That is, a simple comparison between these internal quantum efficiencies suggests that the $Mn^{2+}$-activated γ-AlON phosphor should have had a higher efficiency of converting excitation light into green light than the $Eu^{2+}$-activated β-SiAlON phosphor. Hence, a comparison between the light-emitting device 10V of Comparative Example D1, which contained the $Mn^{2+}$-activated γ-AlON phosphor alone as a green phosphor, and the light-emitting devices 10 of Examples D1 to D4, which contained the $Eu^{2+}$-activated β-SiAlON phosphor as a second green phosphor, suggests that the light-emitting device 10V of Comparative Example D1 should have had a higher luminous efficiency than the light-emitting devices 10 of Examples D1 to D4.

In practice, however, as shown in FIG. 8, the light-emitting devices 10 of the Examples, which contained the $Eu^{2+}$-activated β-SiAlON phosphor, had higher luminous efficiencies than the light-emitting device 10V of the Comparative Example, which contained no $Eu^{2+}$-activated β-SiAlON phosphor. This is presumably because the light-emitting devices 10 of Examples D1 to D4 contained smaller amounts of phosphor and thus had a lower light loss due to excessive scattering of light by phosphors than the light-emitting device 10V of Comparative Example D1.

In particular, as shown in FIG. 8, the weight ratios of the phosphor mixture to the dispersion medium in the light-emitting devices 10 of Examples D2 to D4 satisfied 0.3<(total weight of phosphors)/(weight of dispersion medium 14)≤1.2. This indicates that these light-emitting devices 10 had sufficiently low fluidity of the phosphor-dispersed resin and thus had superior suitability for mass production. Furthermore, the light-emitting devices 10 of Examples D3 and D4 satisfied (total weight of phosphors)/(weight of dispersion medium 14)≤1.0. This indicates that these light-emitting devices 10 had particularly superior suitability for mass production.

Second Embodiment

A second embodiment will now be described with reference to FIGS. 3, 7F, 9A and 9B, and 10. The following description is directed toward an image display apparatus 100 including light-emitting devices 10a according to the second embodiment. For illustration purposes, the members having the same functions as those described in the previous embodiment are denoted by the same reference numerals, and a description thereof is omitted.

Image Display Apparatus 100

FIG. 9A is an exploded perspective view of the image display apparatus 100, which is an example of an image display apparatus according to this embodiment. FIG. 9B is an exploded perspective view of a liquid crystal display device 120a in the image display apparatus 100 shown in FIG. 9A. FIG. 3 is a graph showing the transmission spectra of color filters in the image display apparatus 100.

As shown in FIG. 9A, the image display apparatus 100 includes light-emitting devices 10a, a light guide 110, and a liquid crystal display section 120. The light guide 110 is a transparent or translucent light guide. The liquid crystal display section 120 is a display section that displays an image and includes a plurality of liquid crystal display devices 120a. The light-emitting devices 10a are similar to the light-emitting device 10.

The image display apparatus 100 has the plurality of light-emitting devices 10a arranged opposite the surface of the light guide 110 facing away from the liquid crystal display section 120. In this embodiment, as shown in FIG. 9A, the plurality of light-emitting devices 10a are arranged in a matrix. The liquid crystal display section 120, which is composed of the plurality of liquid crystal display devices 120a, is disposed adjacent to the light guide 110. The image display apparatus 100 is configured such that light 130 emitted from the light-emitting devices 10a is scattered through the light guide 110 and irradiates the entire surface of the liquid crystal display section 120 in the form of scattered light 140.

Liquid Crystal Display Devices 120a

As shown in FIG. 9B, the liquid crystal display devices 120a forming the liquid crystal display section 120 include, in sequence, a polarizer 121, a transparent conductive film 123a (including thin-film transistors 122), an alignment film 124a, a liquid crystal layer 125, an alignment film 124b, an upper thin-film electrode 123b, a color filter 126 for displaying color pixels, and an upper polarizer 127.

The color filter 126 is divided into segments of the size corresponding to that of the pixels of the transparent conductive film 123a. The color filter 126 includes a red color filter 126r that transmits red light, a green color filter 126g that transmits green light, and a blue color filter 126b that transmits blue light.

The image display apparatus 100 according to this embodiment may include a filter that transmits red, green, and blue light, like the color filter 126 shown in FIG. 9B.

In this case, for example, the individual color filters may have the transmission spectra shown in FIG. 3.

The individual color filters may be color filters having any transmittance and commonly used in image display apparatuses. In particular, the green color filter 126g may be a color filter having a transmittance of 10% or less for light in the wavelength range from 600 nm to 680 nm and having a transmission spectrum with a full width at half maximum of 90 nm or less.

The blue color filter 126b may be a color filter having a transmittance of 10% or less for light in the wavelength range from 520 nm to 680 nm and having a transmission spectrum with a full width at half maximum of 100 nm or less.

Color filters having such transmittance and transmission spectrum characteristics can be used to provide an image display apparatus with a high coverage of the BT.2020 color gamut. Such color filters can be fabricated by known methods, including the method disclosed in Japanese Unexamined Patent Application Publication No. 2015-87527.

Examples and Comparative Example of Image Display Apparatuses

Next, examples and a comparative example of image display apparatuses 100 will be described with reference to FIG. 10. FIG. 10 is a table showing the coverage, the percent area, and the chromaticity coordinates of image display apparatuses 100 of Examples DIS1 to DIS4 according to this embodiment and Comparative Example DIS2.

Examples DIS1 to DIS4

The image display apparatuses of Examples DIS1 to DIS4 were image display apparatuses 100 having the structure shown in FIGS. 9A and 9B. The backlights used in the image display apparatuses 100 of Examples DIS1 to DIS4 were the light-emitting devices 10 of Examples D1 to D4, respectively. The color filters used in the image display apparatuses 100 of Examples DIS1 to DIS4 were color filters having the transmittance shown in FIG. 3, that is, the color filter 126 including the red color filter 126r, the green color filter 126g, and the blue color filter 126b.

Comparative Example D2

Figure 7F:
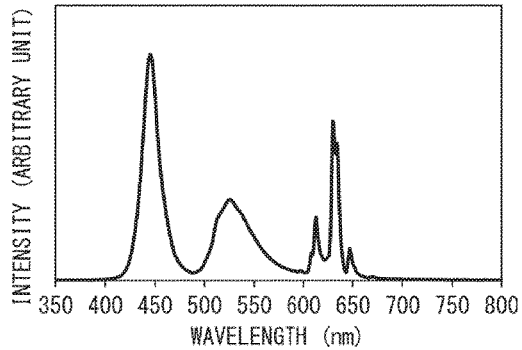

An example of the production of a light-emitting device (Comparative Example D2) used for the production of an image display apparatus (Comparative Example DIS2) for comparison with the image display apparatuses of Examples DIS1 to DIS4 above will now be described with reference to FIG. 7F.

The light-emitting device of Comparative Example D2 had the same structure as the light-emitting device 10 of Example D1 except that the weight ratio of the green phosphor 12a ($Mn^{2+}$-activated γ-AlON phosphor of Production Example G1) to the green phosphor 12b ($Eu^{2+}$-activated β-SiAlON phosphor of Production Example G2) was 11.9, the weight ratio of the green phosphors to the red phosphor 13 ($Mn^{4+}$-activated $K_2SiF_6$ phosphor of Production Example R1) was 5.3, and the weight ratio of the phosphors to the dispersion medium (silicone resin) was 0.55.

The resulting light-emitting device was then driven at a drive current of 30 mA, and the emission spectrum was measured with a spectrophotometer (MCPD-7000). As a result, the emission spectrum shown in FIG. 7F was obtained. In Comparative Example D2, the amounts of red and green phosphors dispersed were adjusted so that the chromaticity point indicating the white point of light having the emission spectrum shown in FIG. 7F after passage through a liquid crystal panel represented a white color with a color temperature of 10,000 K, which lies near (CIEx, CIEy)=(0.281, 0.288).

Comparative Example DIS2

The image display apparatus of Comparative Example DIS2 was an image display apparatus 100 having the structure shown in FIGS. 9A and 9B. The backlight used in the image display apparatus 100 of Comparative Example DIS2 was the light-emitting device of Comparative Example D2. The color filter used was a color filter having the transmittance shown in FIG. 3, that is, the color filter 126 including the red color filter 126r, the green color filter 126g, and the blue color filter 126b.

Evaluation of Image Display Apparatuses

FIG. 10 shows (1) the chromaticity coordinates, in the CIE 1931 chromaticity diagram, of the red, green, and blue points of light displayed on the display (screen) and (2) the BT.2020 coverage and percent area of the image display apparatuses 100 of Examples DIS1 to DIS4 and Comparative Example DIS2 above.

As used herein, the term "red point" refers to the chromaticity point on a display (screen) on which only light passing through a red color filter is displayed. The term "green point" refers to the chromaticity point on a display (screen) on which only light passing through a green color filter is displayed. The term "blue point" refers to the chromaticity point on a display (screen) on which only light passing through a blue color filter is displayed. The term "BT.2020 coverage" refers to the proportion of the area of the BT.2020 color gamut covered by the color gamut enclosed by the red, green, and blue points. The term "BT.2020 percent area" refers to the proportion of the area of the color gamut enclosed by the red, green, and blue points relative to the area of the BT.2020 color gamut.

The chromaticity points, the BT.2020 coverages, and the BT.2020 percent areas shown in FIG. 10 were calculated from spectrum data obtained using an MCPD-7000 available from Otsuka Electronics Co., Ltd.

FIG. 10 shows that the image display apparatuses 100 of Examples DIS1 to DIS4 had high coverages of the BT.2020 color gamut, i.e., not less than 80%. This indicates that not only does the light-emitting device 10 have good luminous efficiency and suitability for mass production, but also an image display apparatus 100 with high color reproduction performance can be provided. In contrast, the image display apparatus of Comparative Example DIS2 had a BT.2020 percent area of more than 80% but had a BT.2020 coverage of less than 80%. This is presumably because the excessive weight ratio of the green phosphor 12b (Eu$^{2+}$-activated β-SiAlON phosphor) narrowed the color gamut of the image display apparatus.

In practice, the color gamut of an image display apparatus is more sensitive to the value of the coverage than to the value of the percent area. That is, when an image display apparatus is used as a display apparatus that complies with the BT.2020 standard, the color gamut of the image display apparatus can be actually improved by improving the coverage of the BT.2020 color gamut.

Third Embodiment

A third embodiment will now be described. The third embodiment is an alternative embodiment of the light-emitting device described in the first embodiment. The members other than the light-emitting element 11 of the light-emitting device according to this embodiment are identical to those of the light-emitting device 10; therefore, a description thereof is omitted.

The primary light (excitation light) emitted from the light-emitting element of the light-emitting device according to this embodiment has a peak wavelength of from 420 nm to 440 nm. A light-emitting element that emits primary light (excitation light) with such a peak wavelength can also be used to provide a light-emitting device with which an image display apparatus with a wide color gamut can be provided.

Nevertheless, the light-emitting device 10 according to the first embodiment has a higher luminous efficiency than the light-emitting device according to this embodiment since, as described above, there is a good wavelength match between the peak wavelength of the primary light (excitation light) and the excitation spectrum of the green phosphor 12a, the excitation spectrum of the red phosphor 13, and the transmission spectrum of the blue color filter 126b.

Relationship Between Peak Wavelength of Primary Light and Luminous Efficiency

The relationship between the peak wavelength of the primary light and luminous efficiency will now be described with reference to FIG. 11. FIG. 11 is a table showing the mixing ratio of the two green phosphors (Mn$^{2+}$-activated γ-AlON phosphor and Eu$^{2+}$-activated β-SiAlON phosphor) dispersed in the dispersion medium 14, the mixing ratio of the green phosphors to the red phosphor, and the mixing ratio of all phosphors to the dispersion medium (resin) in the light-emitting devices 10 of Examples D5 and D6 according to this embodiment and the measured luminous flux (relative value) of the light-emitting devices 10. For comparison of luminous efficiency, FIG. 11 also shows data for the light-emitting device 10 of Example D1 according to the first embodiment. The luminous fluxes (relative values) of the light-emitting devices of the Examples are shown in FIG. 11, with the luminous flux (luminous efficiency) of the light-emitting device 10 of Example D1 being 100.

As shown in FIG. 11, in Example D5 according to this embodiment, the primary light (excitation light) emitted from the light-emitting element 11 had a peak wavelength of 430 nm. In Example D6 according to this embodiment, the primary light had a peak wavelength of 440 nm. In Examples D5 and D6 according to this embodiment, as in Example D1, the green phosphor produced in Production Example G1 was used as the green phosphor 12a, the green phosphor produced in Production Example G2 was used as the green phosphor 12b, and the red phosphor produced in Production Example R1 was used as the red phosphor 13. The red phosphor 13, the green phosphor 12a, and the green phosphor 12b were dispersed in the dispersion medium 14 in the mixing ratios shown in FIG. 11. As in Examples D1 to D4 above, the mixing ratios of the red phosphor 13, the green phosphors 12a and 12b, and the dispersion medium 14 in Examples D5 and D6 were adjusted so that the chromaticity point indicating the white point of light after passage through a liquid crystal panel including a color filter having the transmission spectra shown in FIG. 3 represented a white color with a color temperature of 10,000 K, which lies near (CIEx, CIEy)=(0.281, 0.288).

As shown in FIG. 11, the luminous efficiency of Example D5 (peak wavelength of light-emitting element 11: 430 nm) was 83, with the luminous efficiency of Example D1 (peak wavelength of light-emitting element 11: 445 nm) being 100. Thus, as described above, the luminous efficiency of Example D5 was lower than that of Example D1. Nevertheless, the luminous efficiency of Example D5 was sufficient to achieve the desired luminous efficiency that could be achieved by an image display apparatus according to an aspect of the present disclosure.

The luminous efficiency of Example D6 (peak wavelength of light-emitting element 11: 440 nm) was 97, with the luminous efficiency of Example D1 being 100. Thus, the luminous efficiency achieved in Example D6 was similar to that achieved in Example D1.

As can be seen from the results in FIG. 11, the luminous efficiency of the light-emitting device 10 according to this embodiment, which includes a light-emitting element that emits primary light with a peak wavelength of from 420 nm to 440 nm, is sufficient to achieve the desired luminous efficiency that can be achieved by an image display apparatus according to an aspect of the present disclosure. Thus, the light-emitting device 10 according to this embodiment can be used for the image display apparatus.

Overview

A light-emitting device (10) according to a first aspect of the present disclosure includes a light-emitting element (11) that emits blue light; a $Mn^{2+}$-activated γ-AlON phosphor (12a) and a $Eu^{2+}$-activated β-SiAlON phosphor (12b) that are excited by the blue light to emit green light; and a red phosphor (13) that is excited by the blue light to emit red light. The weight ratio of the $Mn^{2+}$-activated γ-AlON phosphor to the $Eu^{2+}$-activated β-SiAlON phosphor is from 20 to 75.

This configuration provides a light-emitting device that has both a wide color gamut and high luminous efficiency through the use of a combination of two green phosphors. As a result, the light-emitting device can be used to provide an image display apparatus that has both a wide color gamut and high luminous efficiency. In addition, the total amount of phosphor dispersed in the dispersion medium can be reduced to alleviate a decrease in the fluidity of the dispersion medium. This provides the advantage of alleviating a decrease in the yield of the light-emitting device and thus ensuring sufficient suitability for mass production with stable quality.

According to a second aspect of the present disclosure, in the light-emitting device according to the first aspect, the $Mn^{2+}$-activated γ-AlON phosphor may have an emission spectrum with a full width at half maximum of from 35 nm to 45 nm.

This configuration has the advantage of widening the color gamut of an image display apparatus including the above light-emitting device and thus improving its color reproduction performance.

According to a third aspect of the present disclosure, in the light-emitting device according to the first or second aspect, the $Eu^{2+}$-activated β-SiAlON phosphor may have an emission spectrum with a full width at half maximum of from 45 nm to 52 nm.

This configuration has the advantage of improving the color reproduction performance of an image display apparatus including the above light-emitting device and also effectively reducing the amount of $Mn^{2+}$-activated γ-AlON phosphor used and thus improving the luminous efficiency.

According to a fourth aspect of the present disclosure, in the light-emitting device according to any one of the first to third aspects, the $Mn^{2+}$-activated γ-AlON phosphor may have an emission spectrum with a peak wavelength of from 520 nm to 527 nm, and the $Eu^{2+}$-activated β-SiAlON phosphor may have an emission spectrum with a peak wavelength of from 525 nm to 535 nm.

This configuration has the same advantage as the third aspect.

According to a fifth aspect of the present disclosure, in the light-emitting device according to any one of the first to fourth aspects, the $Mn^{2+}$-activated γ-AlON phosphor may contain Mg.

This configuration stabilizes the crystal structure of the γ-AlON crystals of the $Mn^{2+}$-activated γ-AlON phosphor and thus allows Mn to be readily incorporated into the phosphor. This allows the Mn concentration of the $Mn^{2+}$-activated γ-AlON phosphor to be readily increased, thus improving the luminous efficiency of the above light-emitting device.

According to a sixth aspect of the present disclosure, in the light-emitting device according to any one of the first to fifth aspects, the red phosphor may be a $Mn^{4+}$-activated fluoride complex phosphor.

This configuration improves the luminous efficiency of the above light-emitting device since $Mn^{4+}$-activated fluoride complex phosphors emit red light having an emission spectrum with a small full width at half maximum and also have high excitation efficiency for blue light. In addition, the color gamut can be widened toward the red side, thus providing a light-emitting device with superior color reproduction performance in the red region.

According to a seventh aspect of the present disclosure, in the light-emitting device according to the sixth aspect, the $Mn^{4+}$-activated fluoride complex phosphor may be represented by the general formula $K_2(Ti_{1-h}Mn_h)F_6$ or the general formula $K_2(Si_{1-h}Mn_h)F_6$, where h is from 0.001 to 0.1.

If the $Mn^{4+}$-activated fluoride complex phosphor is $K_2(Ti_{1-h}Mn_h)F_6$ or $K_2(Si_{1-h}Mn_h)F_6$, where h is from 0.001 to 0.1, this configuration improves the luminous efficiency and reliability of the above light-emitting device since the $Mn^{4+}$-activated fluoride complex phosphor has high emission intensity and high phosphor crystal stability.

According to an eighth aspect of the present disclosure, in the light-emitting device according to the sixth or seventh aspect, the $Mn^{4+}$-activated fluoride complex phosphor may be a $Mn^{4+}$-activated $K_2SiF_6$ phosphor.

This configuration improves the reliability of the above light-emitting device since $Mn^{4+}$-activated $K_2SiF_6$ phosphors have high stability (water resistance).

According to a ninth aspect of the present disclosure, in the light-emitting device according to any one of the first to eighth aspects, the blue light may have a peak wavelength of from 440 nm to 460 nm.

This configuration increases the excitation efficiency of the $Mn^{2+}$-activated γ-AlON phosphor, the $Eu^{2+}$-activated β-SiAlON phosphor, and the red phosphor. There is also a good wavelength match with a blue color filter that transmits blue light. Thus, the luminous efficiency of the light-emitting device can be improved. In addition, the luminance (display brightness) of an image display apparatus including the light-emitting device can be improved.

An image display apparatus (100) according to a tenth aspect of the present disclosure includes the light-emitting device according to any one of the first to ninth aspects.

This configuration has the same advantage as the above light-emitting device.

According to an eleventh aspect of the present disclosure, the image display apparatus according to the tenth aspect may further include a green color filter (126g) that transmits green light and a blue color filter (126b) that transmits blue light. The green color filter may have a transmittance of 10% or less for light in a wavelength range from 600 nm to 680 nm and may have a transmission spectrum with a full width at half maximum of 90 nm or less. The blue color filter may have a transmittance of 10% or less for light in a wavelength range from 520 nm to 680 nm and may have a transmission spectrum with a full width at half maximum of 100 nm or less.

This configuration further widens the color gamut of the image display apparatus.

Supplementary Notes

The present disclosure is not limited to the foregoing embodiments; various modifications can be made within the scope of the claims, and embodiments having suitable combinations of technical features disclosed in different embodiments are also included in the technical scope of the present disclosure. Furthermore, the technical features disclosed in the foregoing embodiments can be combined to form new technical features.

The present disclosure contains subject matter related to that disclosed in Japanese Priority Patent Application JP 2017-149992 filed in the Japan Patent Office on Aug. 2, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
   a light-emitting element that emits blue light;
   a $Mn^{2+}$-activated γ-AlON phosphor and a $Eu^{2+}$-activated β-SiAlON phosphor that are excited by the blue light to emit green light; and
   a red phosphor that is excited by the blue light to emit red light,
   wherein a weight ratio of the $Mn^{2+}$-activated γ-AlON phosphor to the $Eu^{2+}$-activated β-SiAlON phosphor is from 20 to 75.

2. The light-emitting device according to claim 1, wherein the $Mn^{2+}$-activated γ-AlON phosphor has an emission spectrum with a full width at half maximum of from 35 nm to 45 nm.

3. The light-emitting device according to claim 1, wherein the $Eu^{2+}$-activated β-SiAlON phosphor has an emission spectrum with a full width at half maximum of from 45 nm to 52 nm.

4. The light-emitting device according to claim 1, wherein
   the $Mn^{2+}$-activated γ-AlON phosphor has an emission spectrum with a peak wavelength of from 520 nm to 527 nm, and
   the $Eu^{2+}$-activated β-SiAlON phosphor has an emission spectrum with a peak wavelength of from 525 nm to 535 nm.

5. The light-emitting device according to claim 1, wherein the $Mn^{2+}$-activated γ-AlON phosphor contains Mg.

6. The light-emitting device according to claim 1, wherein the red phosphor is a $Mn^{4+}$-activated fluoride complex phosphor.

7. The light-emitting device according to claim 6, wherein the $Mn^{4+}$-activated fluoride complex phosphor is represented by the general formula $K_2(Ti_{1-h}Mn_h)F_6$ or the general formula $K_2(Si_{1-h}Mn_h)F_6$, where h is from 0.001 to 0.1.

8. The light-emitting device according to claim 6, wherein the $Mn^{4+}$-activated fluoride complex phosphor is a $Mn^{4+}$-activated $K_2SiF_6$ phosphor.

9. The light-emitting device according to claim 1, wherein the blue light has a peak wavelength of from 440 nm to 460 nm.

10. An image display apparatus comprising the light-emitting device according to claim 1.

11. The image display apparatus according to claim 10, further comprising:
    a green color filter that transmits green light; and
    a blue color filter that transmits blue light,
    wherein the green color filter has a transmittance of 10% or less for light in a wavelength range from 600 nm to 680 nm and has a transmission spectrum with a full width at half maximum of 90 nm or less, and
    wherein the blue color filter has a transmittance of 10% or less for light in a wavelength range from 520 nm to 680 nm and has a transmission spectrum with a full width at half maximum of 100 nm or less.

* * * * *